(12) United States Patent
Mankos (10) Patent No.: US 9,406,479 B1
(45) Date of Patent: Aug. 2, 2016

(54) MIRROR PULSE COMPRESSOR FOR ELECTRON BEAM APPARATUS

(71) Applicant: Marian Mankos, Palo Alto, CA (US)

(72) Inventor: Marian Mankos, Palo Alto, CA (US)

(73) Assignee: Electron Optica, Inc., Palo Alto, CA (US)

( * ) Notice: Subject to any disclaimer, the term of this patent is extended or adjusted under 35 U.S.C. 154(b) by 0 days.

(21) Appl. No.: 14/751,087

(22) Filed: Jun. 25, 2015

(51) Int. Cl.
*G21K 5/04* (2006.01)
*H01J 37/147* (2006.01)
*H01J 37/285* (2006.01)
*H01J 37/28* (2006.01)
*H01J 37/20* (2006.01)
*H01J 37/14* (2006.01)

(52) U.S. Cl.
CPC ............. *H01J 37/1471* (2013.01); *H01J 37/14* (2013.01); *H01J 37/20* (2013.01); *H01J 37/28* (2013.01); *H01J 37/285* (2013.01); *H01J 2237/1523* (2013.01); *H01J 2237/2802* (2013.01)

(58) Field of Classification Search
USPC ....... 250/396 R, 397, 398, 305, 492.1, 492.3; 315/500, 501, 502, 503, 504, 505, 506, 315/507
See application file for complete search history.

(56) References Cited

U.S. PATENT DOCUMENTS 8,633,438 B2    1/2014  Tokita
2009/0095904 A1*  4/2009  Koike ................... H01J 37/153
                                             250/311
2011/0186748 A1*  8/2011  Ruffell ................ H01J 37/1474
                                             250/400

OTHER PUBLICATIONS

T. Van Oudheusden et al., Electron source concept for single-shot sub-100 fs electron diffraction in the 100 keV range, Journal of Applied Physics vol. 102, p. 093501, 2007.
K. Grzelakowski and R. Tromp, Temporal and Lateral Electron Pulse Compression by a Compact Spherical Electrostatic Capacitor, Ultramicroscopy vol. 130, p. 36, 2013.
G. H. Kassier et al., Achromatic reflectron compressor design for bright pulses in femtosecond electron diffraction, Journal of Applied Physics vol. 105, p. 113111, 2009.
Y. Wang and N. Gedik, Electron Pulse Compression With a Practical Reflectron Design for Ultrafast Electron Diffraction, IEEE Journal of selected topics in quantum electronics, vol. 18, p. 140, 2012.

* cited by examiner

*Primary Examiner* — Nicole Ippolito (57) ABSTRACT

One embodiment pertains to an apparatus for compressing an electron pulse. An electron source is illuminated by a pulsed laser and generates a pulse of electrons. The pulse enters a beam separator which deflects the electrons by 90 degrees into an electron mirror. The faster, higher energy electrons form the leading edge of the pulse and penetrate more deeply into the retarding field of the electron mirror than the lower energy electrons. After reflection, the lower energy electrons exit the electron mirror before the higher energy electrons and form the leading edge of the pulse. The reflected pulse reenters the separator and is deflected by 90 degrees towards the specimen. The fast, higher energy electrons catch up with the slow, low energy electrons as the electrons strike the specimen. The electrons are scattered by the specimen and used to form a two-dimensional image or diffraction pattern of the specimen.

15 Claims, 7 Drawing Sheets

MIRROR PULSE COMPRESSOR FOR ELECTRON BEAM APPARATUS

BACKGROUND OF THE INVENTION

1. Field of the Invention

The present invention relates generally to charged particle beam apparatus, and more specifically to electron microscopy and electron diffraction methods for high spatial resolution observation of ultrafast dynamical processes on the femtosecond scale.

2. Description of the Background Art

Optical microscopes, the simplest and most common instruments used to image objects too small for the naked eye to see, uses photons with visible wavelengths for imaging. The specimen is illuminated with a broad light beam, and a magnified image of the specimen can be observed using an eye piece or camera. The maximum magnification of a light microscope can be more than 1000× with a diffraction-limited resolution limit of a few hundred nanometers. Improved spatial resolution in an optical microscope can be achieved when shorter wavelengths of light, such as the ultraviolet, are utilized for imaging.

An electron microscope is a type of microscope that uses electrons to illuminate the specimen and create a magnified image of it. The microscope has a greater resolving power than a light microscope, because it uses electrons that have wavelengths few orders of magnitude shorter than visible light, and can achieve magnifications exceeding 1,000,000×. In a typical electron microscope, an electron beam is emitted in a vacuum chamber from an electron gun equipped with a thermionic (tungsten, $LaB_6$), thermally assisted (Schottky, $ZrO_2$) or cold field emission cathode. The primary electron beam, which typically has an energy ranging from a few hundred eV to few hundred keV and an energy spread ranging from few tenths to few eV, is collimated by one or more condenser lenses and then focused by the final objective lens to form a spot that illuminates the specimen. Primary electrons can generate elastically scattered electrons, secondary electrons due to inelastic scattering, characteristic Auger electrons and the emission of electromagnetic radiation. Each of the generated signals can be detected by specialized detectors, amplified and displayed on a screen or captured digitally, pixel by pixel on a computer.

Scanning electron microscopes, the most widely used electron microscopes, image the sample surface by scanning it with a tightly focused beam of electrons in a raster scan pattern, pixel by pixel. Transmission electron microscopes (TEM) and low energy electron microscopes (LEEM) are projection (as opposed to scanning) electron microscopes, and thus resemble a conventional light microscope. In a TEM or LEEM, the electron gun forms a broad electron beam that is accelerated to typically a few to hundreds of keV and focused by the objective lens. A parallel flood beam then uniformly illuminates the substrate.

The observation of dynamical processes in conventional electron microscopes is limited by the frame acquisition rate, which is typically on the order of milliseconds to seconds. However, many dynamical processes at the atomic scale occur on timescales as short as tens to hundreds of femtoseconds. Pulsed laser techniques have the requisite temporal resolution, but not the spatial resolution to follow these processes. In order to resolve structural dynamics on the ultrafast timescale, pulsed electron techniques have recently been developed. In Ultrafast electron diffraction (UED) and Dynamic transmission electron microscopy (DTEM), unprecedented combined spatial and temporal resolution is obtained by illuminating a photocathode with an ultrafast, sub-picosecond pulse generated by a pulsed laser, accelerating the photoemitted electrons and illuminating a specimen with the ultrafast electron pulse to obtain time-resolved electron diffraction patterns or images. Unfortunately, electron-electron interactions broaden the pulse as they travel from the photocathode to the sample, resulting in a loss of temporal resolution when the pulse arrives at the specimen. One option is to reduce or eliminate this broadening by greatly reducing the number of electrons in the pulse. However, the lower electron count increases the data acquisition time and in most implementations requires that the sample be reproducibly pumped and probed $10^6$ times to obtain images or diffraction patterns of sufficient quality. Another option is to increase the beam energy into the MeV range to minimize the electron interaction time and thus the Coulomb interactions. However, electrons with such high kinetic energies not only have low scattering cross-sections yielding weak contrast, they also inevitably cause radiation damage on most types of specimens. Significant efforts have been made to shorten these ultrafast electron pulses, but there is a very strong demand to further improve the temporal resolution of the probing pulse to reach deep into the femtosecond range at typical TEM electron energies (80-120 keV) and without sacrificing the total pulse charge.

One approach to reduce or eliminate this temporal broadening is to use a Radio Frequency (RF) cavity, such as the one disclosed by T. van Oudheusden et al. in the paper entitled "Electron source concept for single-shot sub-100 fs electron diffraction in the 100 keV range" and which was published in the Journal of Applied Physics vol. 102, p. 093501, in 2007. In the RF approach, the time-varying field of an RF cavity is used to compress the pulse to the 100 femtosecond level. As the longitudinally-broadened pulse enters the RF cavity, the leading higher energy electrons are decelerated, while the trailing lower energy electrons are accelerated. At the cavity exit, the velocity-position distribution is reversed: the higher energy electrons trail the lower energy electrons. The electrons are then brought to a temporal focus on the specimen at some distance from the cavity. Both the phase and amplitude of the time-varying electric field in the cavity must be carefully tuned to the incident electron pulse, limiting the resolution of the temporal focus to ~100 femtoseconds. Although RF methods have great potential, they lack the technical simplicity of static electron optics. Furthermore, synchronization of the RF cavity with the pulsed laser can be a challenge.

Another approach to reduce or eliminate this temporal broadening is to use a magnetic 360° deflector, such as the one disclosed in U.S. Pat. No. 8,633,438, which is entitled "Ultrafast electron diffraction device" and which was granted on Jan. 21, 2014 to inventors Tokita, Hashida and Sakabe. In this approach, the pulse is compressed by a deflector utilizing the energy dispersion of dipole magnets. The dipole magnet system utilizes static magnetic fields with a net deflection of 360 degrees. Here, temporal compression to about ~200 femtoseconds has been achieved. Although the incident and exiting electron paths are parallel, they do not coincide due to an out of-plane offset between the magnets in the first and the second half of the deflection, which makes alignment and beam set up challenging. In addition, simple magnetic dipole deflectors exhibit focusing action mainly in the plane of deflection, necessitating the application of additional optical focusing elements. Furthermore, the deflectors introduce significant and unavoidable aberrations.

Another approach to reduce or eliminate this temporal broadening is to use a electrostatic 360° deflector, such as the one disclosed in the paper by K. Grzelakowski and R. Tromp in the paper entitled "Temporal and Lateral Electron Pulse Compression by a Compact Spherical Electrostatic Capacitor" and which was published in Ultramicroscopy vol. 130, p. 36, in 2013. In this approach, the pulse is compressed by a deflector utilizing the energy dispersion of electrostatic capacitors. The electrostatic capacitor system utilizes the central-force electrostatic field of a spherical electrostatic capacitor to compress the electron pulse. It has mirror symmetry which cancels the deflector aberrations and has compact in-line construction which provides a straight line-of-sight from source to sample. However, the symmetry invoked by the electrostatic capacitor also compresses the pulse at the deflector midplane, after a 180° deflection, which is likely to result in significant Coulomb repulsion effects.

Another approach to reduce or eliminate this temporal broadening is to use an electrostatic mirror, such as the one disclosed by G. H. Kassier et al. in the paper entitled "Achromatic reflectron compressor design for bright pulses in femtosecond electron diffraction" and which was published in the Journal of Applied Physics vol. 105, p. 113111, in 2009, and such as the one disclosed by Y. Wang and N. Gedik in the paper entitled "Electron Pulse Compression With a Practical Reflectron Design for Ultrafast Electron Diffraction" and which was published in IEEE Journal of selected topics in quantum electronics, vol. 18, p. 140, in 2012. In this approach, the pulse is compressed because the higher energy electrons penetrate more deeply into the mirror, resulting in a longer beam path. For a substantial beam path differential between the high and low energy electrons, the higher energy electrons will trail the lower energy electrons, resulting in pulse compression downstream. However, these mirror compressors share a common feature: the pulse enters the mirror at a relatively large entrance angle in order to separate the incoming and outgoing pulse. The skewed entry complicates the overall column alignment, as there is no direct line of sight from the electron source to the specimen. In addition, the large entrance angle introduces significant aberrations and a significant tilt of the pulse front, which complicates the experimental setup.

There is significant demand in biological and medical research as well materials science and semiconductor processing for imaging of specimens at high temporal and spatial resolution. An improved pulse compressor and methods for providing temporal compression that overcome the disadvantages of the above-mentioned approaches are desirable.

SUMMARY

One embodiment pertains to an apparatus for compressing an electron pulse. An electron beam source is illuminated by a pulsed photon beam and configured to generate a pulse of electrons and accelerate the photoemitted electrons. The electron pulse enters a beam separator which deflects the electrons by 90 degrees off the optical axis. Higher energy electrons are faster and form the leading edge of the pulse, while lower energy electrons are slower and form the trailing edge of the pulse. An electron lens is configured to focus the electron pulse into an electron mirror. Higher energy electrons penetrate more deeply into the retarding field of the electron mirror than the lower energy electrons, leading to a longer path length in the mirror. Lower energy electrons penetrate less deeply into the retarding field of the electron mirror than the higher energy electrons, leading to a shorter path length in the mirror. After reflection, the lower energy electrons exit the electron mirror before the higher energy electrons and form the leading edge of the pulse, while higher energy electrons exit the electron mirror after the low energy electrons and form the trailing edge of the pulse. The reflected electron pulse reenters the beam separator and is deflected by 90 degrees back into the optical axis. The electrons travel towards the specimen and the faster high energy electrons catch up with the slower electrons as the electrons strike the specimen. The electrons are scattered by the specimen and used to form a two-dimensional image or diffraction pattern of the specimen.

DETAILED DESCRIPTION

Electron Mirror-Based Pulse Compressor

Figure 1:
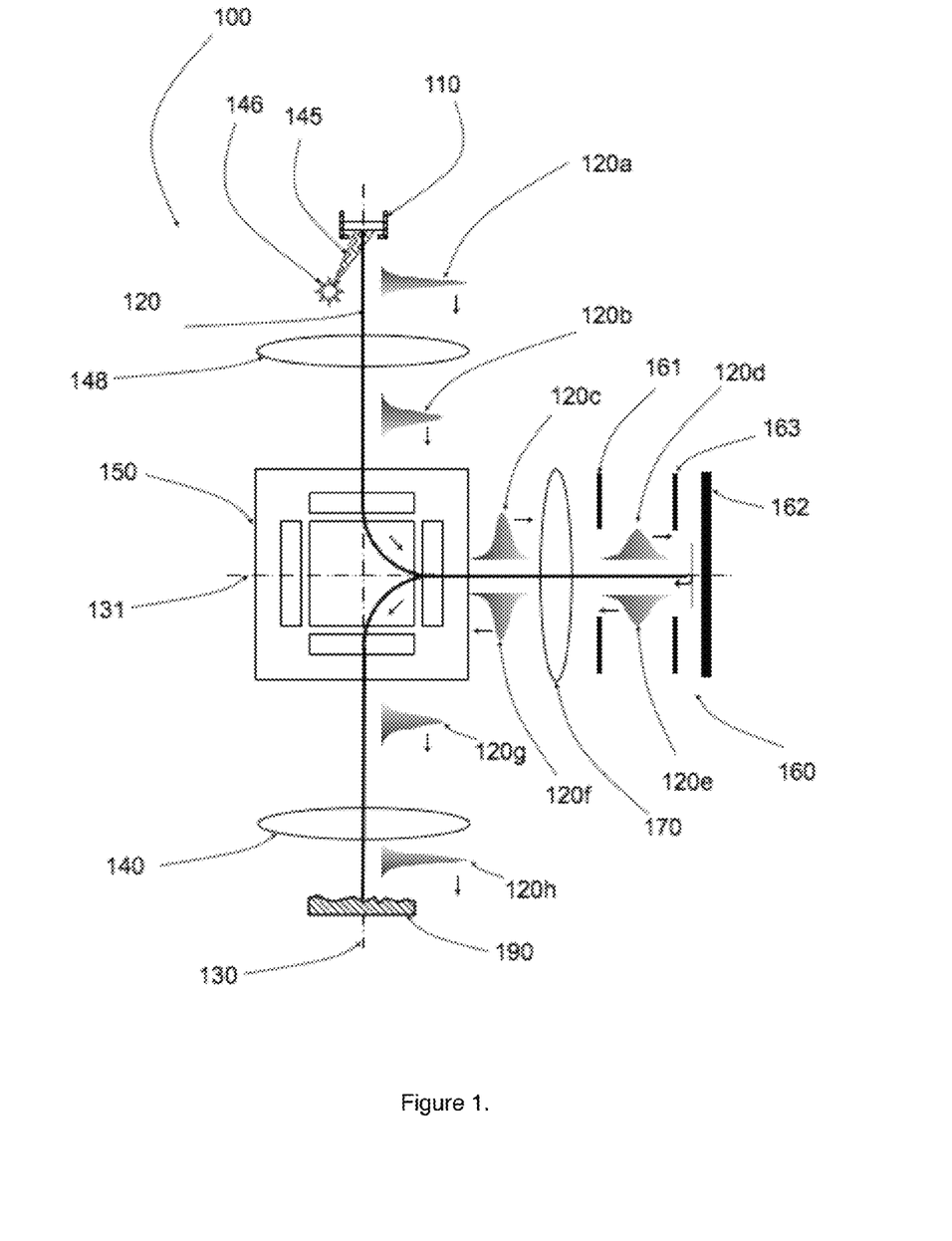
FIG. 1 is a diagram depicting a structure for an electron beam apparatus having an electron mirror-based pulse compressor in accordance with an embodiment of the invention.
Figure 2:
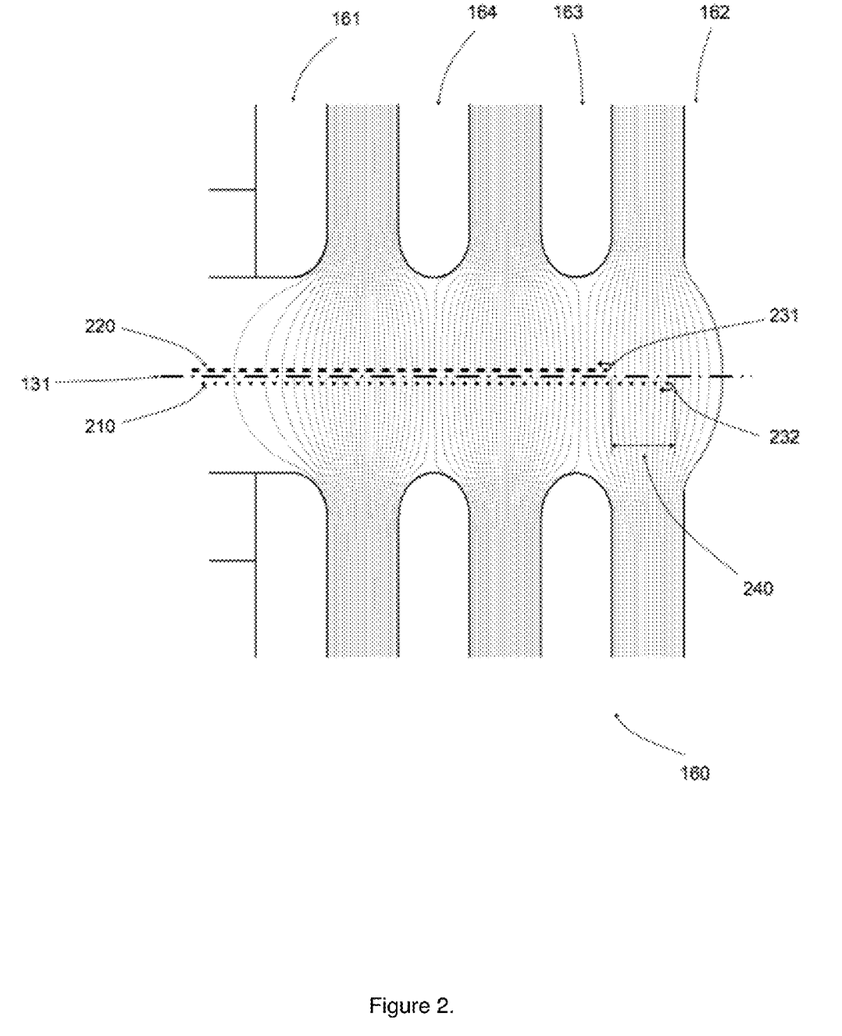
FIG. 2 is a diagram depicting the trajectories of electrons with two different energies in an electron beam apparatus utilizing an electron mirror-based pulse compressor in accordance with an embodiment of the invention.

FIG. 1 is a diagram depicting a structure for an electron beam apparatus 100 comprising a magnetic prism separator and an electron mirror that are configured as an electron pulse compressor. In this apparatus 100, an electron emitter 110 generates an ultrashort pulse of primary electrons 120a along the vertical optical axis 130 defined by the objective lens 140. The duration of an ultrafast pulse is typically less than 1 picosecond. In one implementation, the electron emitter 110 is a photocathode and the ultrafast pulse of electrons is generated by illuminating the photocathode with photons 145 generated by a pulsed laser 146. One or more condenser lenses 148 collimate the primary electron pulse into the magnetic prism separator 150, a deflection element composed of an array of uniform magnetic fields of different length and strength so as to provide a mechanism for simultaneous deflection and stigmatic focusing. An optimized prism separator 150 simultaneously images stigmatically the primary electron pulse 120 and deflects this beam by 90 degrees into the horizontal optical axis 131 defined by electron mirror 160. Coulomb interactions between the electrons broaden the pulse as they travel from the photocathode to the sample, resulting in a loss of temporal resolution as the pulse arrives at the specimen 190. The electron-electron interactions mainly increase the electron energy spread (Boersch effect), from a fraction of an electron-Volt to hundreds or even thousands of electron-Volts. The initial electron pulse 120a leaving the electron emitter is very short, typically in the range from a few femtoseconds to a picosecond. As the electron pulse 120b proceeds toward the prism separator 150, the pulse spreads along the direction of its travel, due to the difference in electron velocities caused by the effect of electron-electron interactions. The faster electrons speed ahead, while the slower electrons stay further behind. The prism separator 150 deflects the electron pulse 120b by 90 degrees off the vertical axis 130 towards the electron mirror 160. One or more transfer lenses 170 focus the continuously spreading electron pulse 120c, d into the electron mirror 160. Coulomb interactions between the electrons thus broaden the pulse as the electrons travel from the photocathode to the mirror, resulting in a significant loss of temporal resolution. At the photocathode, the initial pulse 120a can be as short as a few femtoseconds, and is defined by the laser pulse width. By the time the pulse travels through the column, the pulse 120d widens substantially, into the picosecond range. Pulse electrons with higher energies penetrate more deeply into the retarding field of the electron mirror 160 than the pulse electrons with lower energies, leading to a longer path length in the electron mirror 160. This is demonstrated in FIG. 2, which shows a zoomed-in view of the electron mirror 160, and of the approaching electrons 210 with higher energy, and of the approaching electrons 220 with lower energy. The entrance electrode 161 of the electron mirror 160 is at ground potential, while the last electrode 162 must be biased at a potential that is more negative than the photocathode to reflect the approaching electron pulse. The incoming higher energy electrons 210 penetrate deeper into the electron mirror before they are reflected, resulting in a longer beam path in the mirror, while lower energy electrons 220 are reflected earlier. The distance 240 (Δz) between the turnaround point 231 of the lower energy electrons 220 and the turnaround point 232 of the higher energy electrons 210 determines the path differential between the slow electrons 220 and the fast electrons 210 in the pulse. When the path differential exceeds the longitudinal extent of the pulse 120d, the electron mirror 160 reverses the velocity distribution: the fast, higher energy electrons 210 now trail the lower energy electrons 220. The potential of the inner electrodes 163 and 164 is varied to tune the path differential 2×Δz defined by the turn-around point 231 of the slow electrons 220 and the turn-around point 232 of the fast electrons 210 in the pulse while maintaining the mirror in a focused state. In one implementation, the potential of inner electrode 163 is tuned to adjust the path differential, while the potential of inner electrode 164 is tuned to maintain the mirror 160 in a focused state. Once the electron pulse leaves the electron mirror 160, the fast, higher energy electrons 210 begin to catch up with the lower energy electrons 220 until a temporal focus is established at a certain drift distance from the electron mirror 160. Tuning of the potential of inner electrode 163 allows to adjust the temporal focus point downstream from the electron mirror 160. FIG. 2 shows a mirror with two inner electrodes 163 and 164, however mirror designs with additional inner electrodes can be readily implemented to improve tuning of the mirror.

Coming back to FIG. 1, the reflected electron pulse 120e is focused by transfer lenses 170 into the prism separator 150. The partially compressed electron pulse 120f is deflected by 90 degrees back into the vertical axis 130 towards objective lens 140. In principle, the deflection angle of the prism separator 150 can be chosen arbitrarily, however a right angle deflection by 90 degrees is particularly advantageous, since after the second deflection the beam proceeds along the vertical microscope axis 130, i.e. the pulse compressor can be introduced into a column with a straight axis from electron gun 110 to objective lens 140 and specimen 190. The further compressed electron pulse 120g is focused by the objective lens 140 to form a fully compressed electron pulse 120h that illuminates the specimen 190 with a temporal spread comparable to the temporal spread of the electron pulse 120a emitted by the electron gun 110. Once the electron pulse 120h strikes the specimen 190, the electrons are scattered by the specimen 190 and further processed to form a 2-dimensional image or diffraction pattern.

The prism separator- and electron mirror-based pulse compressor, as shown in FIG. 1, can be advantageously implemented in ultrafast electron diffraction (UED) cameras, Dynamic transmission electron microscopes (DTEMs) and low energy electron microscopes (LEEM).

Figure 3:
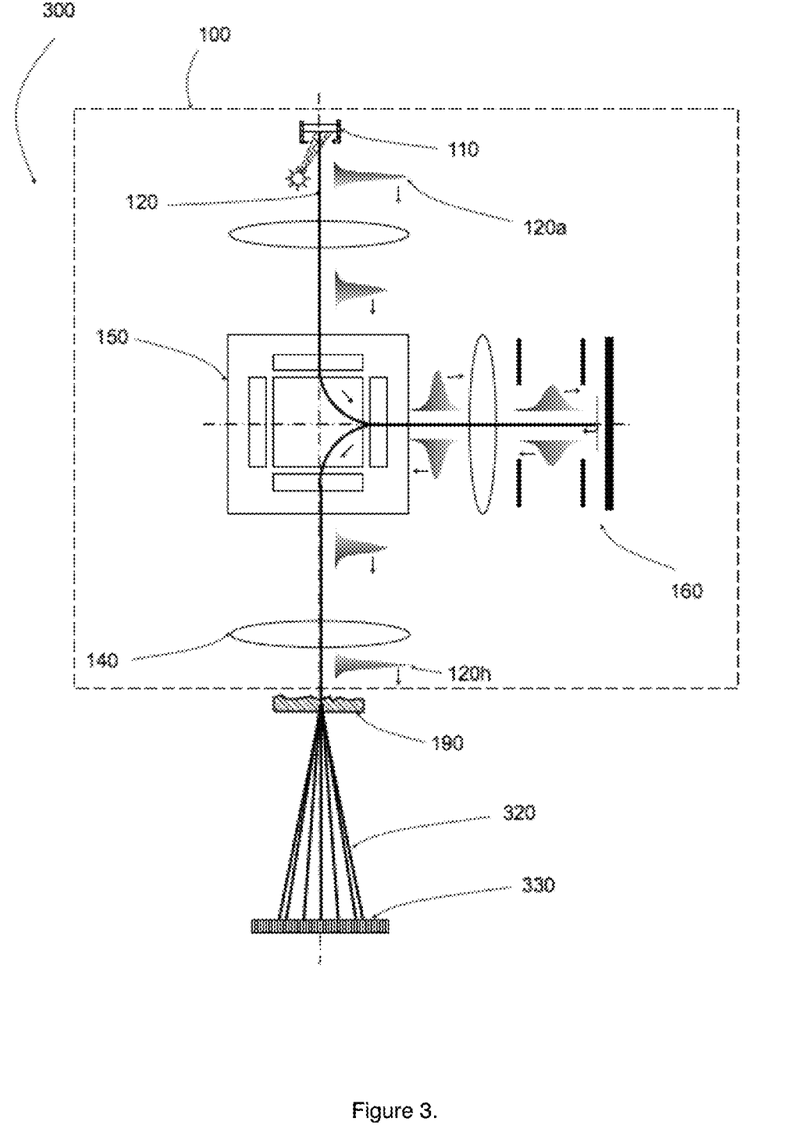
FIG. 3 is a diagram depicting a structure for an electron beam apparatus utilizing an electron mirror-based pulse compressor in a electron diffraction apparatus in accordance with an embodiment of the invention.

FIG. 3 is a diagram depicting a structure for a ultrafast electron diffraction (UED) camera 300 comprising a prism separator 150 and an electron mirror 160 that are configured as a pulse compressor 100. In this UED camera 300, the electron pulse 120 is passed through the pulse compressor 100, and focused by the objective lens 140 to form a fully compressed electron pulse 120h that illuminates the specimen 190 with a temporal spread comparable to the temporal spread of the electron pulse 120a emitted by the electron gun 110. The compressed electron pulse 120h with duration as short as tens to hundreds of femtoseconds strikes the specimen 190. The electron pulse is scattered by the specimen and the transmitted electrons 320 form a diffraction pattern which can be observed on an electron detector 330. In one implementation, the electron detector 330 comprises an electron scintillator, transforming the two-dimensional electron diffraction pattern into a light image, and light optics configured to transport the light image to an image sensor, e.g. a charged-coupled device. In another implementation, the electron detector 330 comprises an charged-coupled device suitable for direct electron detection.

Figure 4:
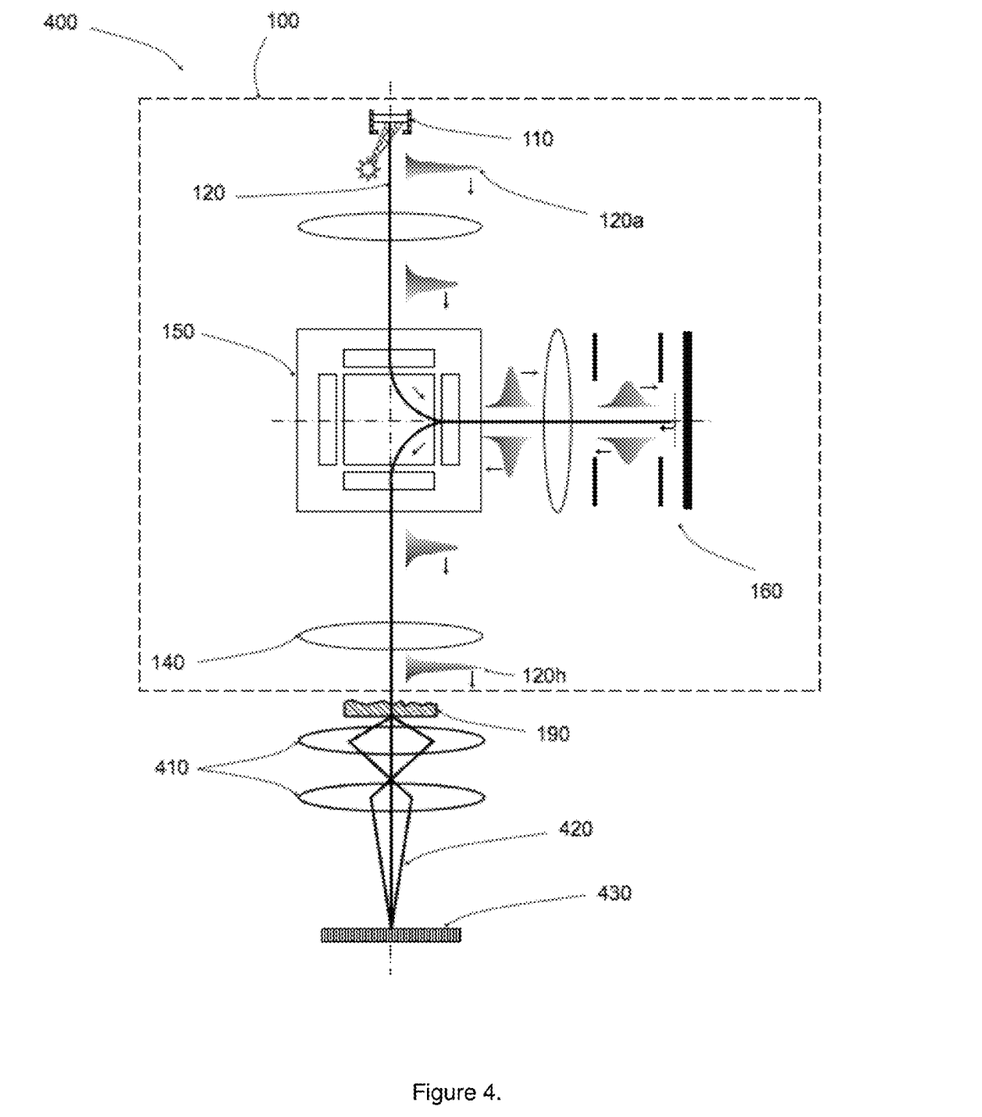
FIG. 4 is a diagram depicting a structure for an electron beam apparatus utilizing an electron mirror-based pulse compressor in a transmission electron microscope in accordance with an embodiment of the invention.

FIG. 4 is a diagram depicting a structure for a Dynamic transmission electron microscope (DTEM) 400 comprising a prism separator 150 and an electron mirror 160 that are configured as a pulse compressor 100. In this DTEM instrument 400, the electron pulse 120 is passed through the pulse compressor 100, and focused by the objective lens 140 to form a fully compressed electron pulse 120h that illuminates the specimen 190 with a temporal spread comparable to the temporal spread of the electron pulse 120a emitted by the electron gun 110. The electron pulse 120h exiting the pulse compressor 100 is focused by the objective lens 140 to form a broad parallel beam that flood-illuminates the specimen 190. The electron pulse is scattered by the specimen and forms a 2-dimensional image. The transmitted scattered electron beam 420 is magnified by the projection optics 410 onto an electron detector 430. In one implementation, the electron detector 430 comprises an electron scintillator, transforming the two-dimensional electron diffraction pattern into a light image, and light optics configured to transport the light image to an image sensor, e.g. a charged-coupled device. In another implementation, the electron detector 430 comprises an charged-coupled device suitable for direct electron detection.

Figure 5:
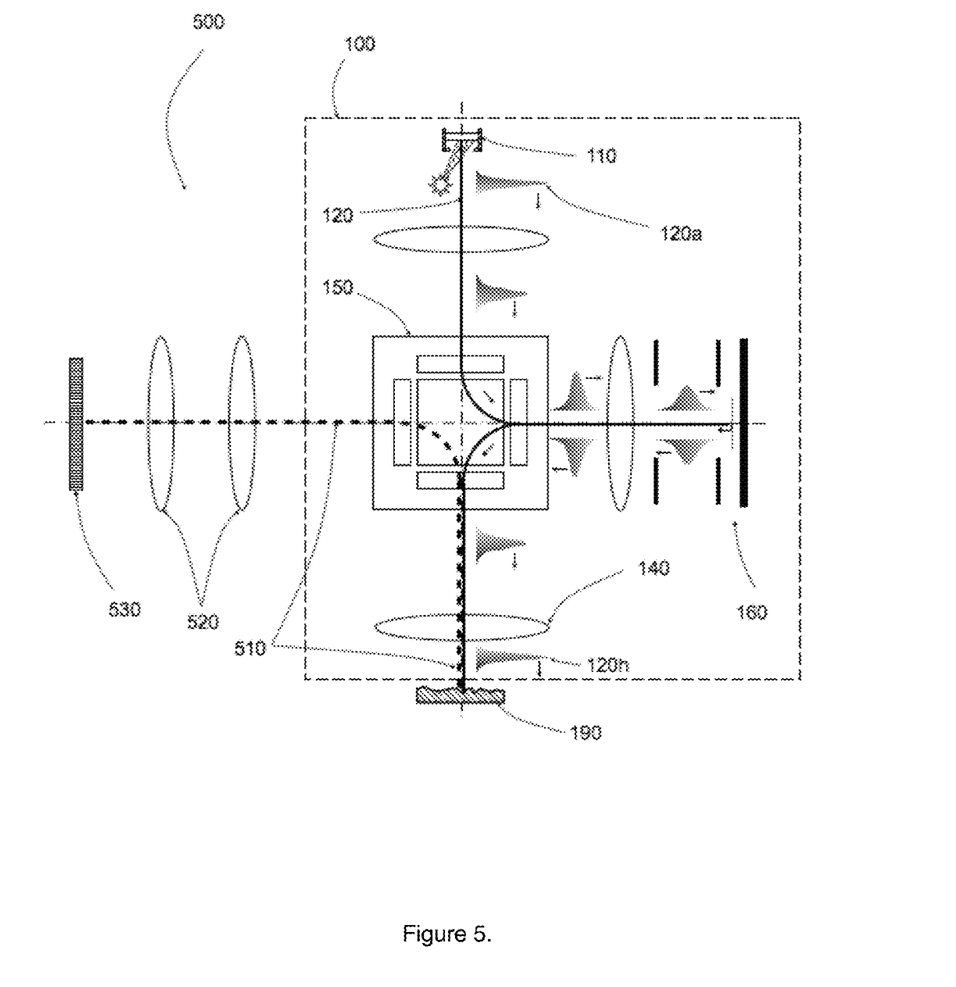
FIG. 5 is a diagram depicting a structure for an electron beam apparatus utilizing an electron mirror-based pulse compressor in a low energy electron microscope in accordance with an embodiment of the invention.

FIG. 5 is a diagram depicting a structure for a Dynamic low energy electron microscope 500 comprising a prism separator 150 and an electron mirror 160 that are configured as a pulse compressor 100. In this instrument 500, the electron pulse 120 is passed through the pulse compressor 100, and decelerated and focused by the objective lens 140 to form a broad parallel beam that flood-illuminates the specimen 190 with electron energies ranging form near zero to a few tens of electron-Volts. The compressed electron pulse 120*h* illuminates the specimen 190 with a temporal spread comparable to the temporal spread of the electron pulse 120*a* emitted by the electron gun 110. The reflected scattered electron pulse 510 then reenters the prism separator 150 and is deflected by 90 degrees into the projection optics. The reflected and scattered electron beam 510 is magnified by the projection optics 520 onto an electron detector 530. In one implementation, the electron detector 530 comprises an electron scintillator, transforming the two-dimensional electron image into a light image, and light optics configured to transport the light image to an image sensor, e.g. a charged-coupled device. In another implementation, the electron detector 530 comprises an charged-coupled device suitable for direct electron detection.

Figure 6:
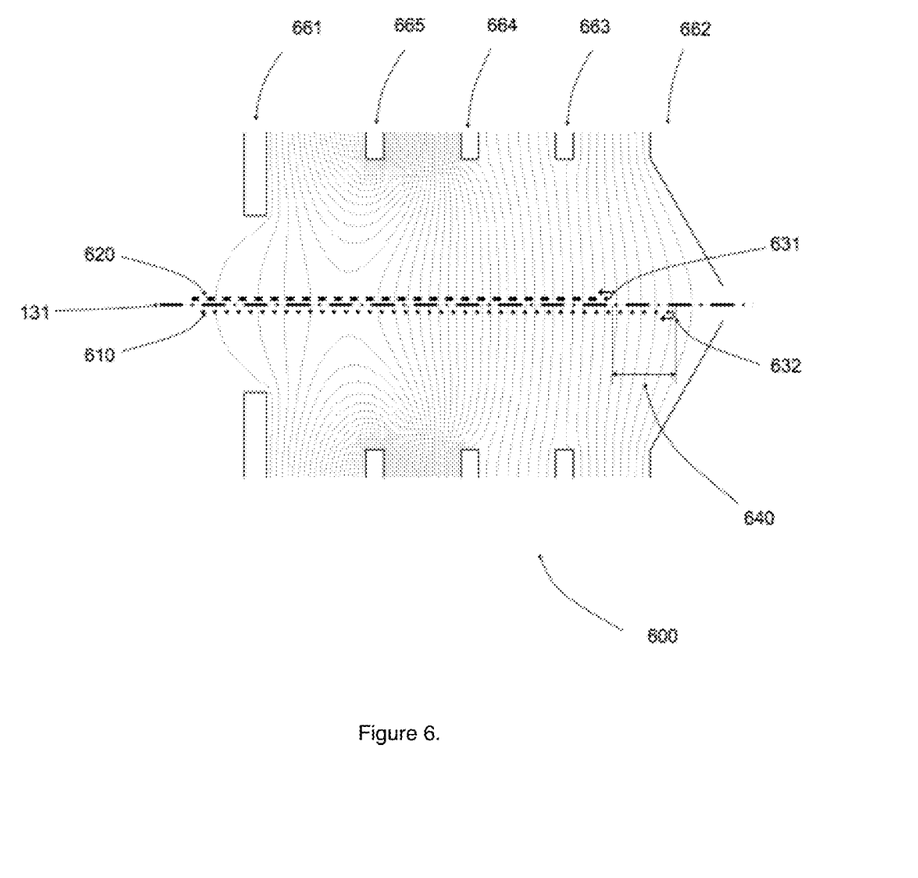
FIG. 6 is a diagram depicting the trajectories of electrons with two different energies in an aberration-correcting electron mirror in accordance with an embodiment of the invention.

In addition to compressing the electron pulse 120, electron mirror 160 can be simultaneously utilized to correct one or more aberrations of the objective lens 140. The geometry of the mirror electrodes as well as the potentials applied to the individual electrodes of electron mirror 160 can be tailored to tune the aberrations of the electron mirror over a wide range, and can be used to offset the aberrations of the objective lens 140. Conventional, rotationally symmetric electron lenses such as objective lens 140 strongly focus electron rays with larger entrance slopes and lower energies, resulting in positive spherical and negative chromatic aberration coefficients. Electron mirrors, on the other hand, can be adjusted to focus the aforementioned rays more weakly, thus yielding tunable spherical and chromatic aberration coefficients with opposite signs that can be used to compensate the objective lens aberrations. FIG. 6 shows a zoomed-in view of an electron mirror 600, which can be simultaneously utilized to correct one or more aberrations of the objective lens 140 and to compress the electron pulse 120. The entrance electrode 161 of the electron mirror 160 is at ground potential, while the last electrode 662 must be biased at a potential that is more negative than the photocathode to reflect the approaching electron pulse. The incoming higher energy electrons 610 penetrate deeper into the electron mirror before they are reflected, resulting in a longer beam path in the mirror, while lower energy electrons 620 are reflected earlier. The distance 640 ($\Delta z$) between the turnaround point 631 of the lower energy electrons 620 and the turnaround point 632 of the higher energy electrons 610 determines the path differential between the slow electrons 620 and the fast electrons 610 in the pulse. When the path differential exceeds the longitudinal extent of the electron pulse, the electron mirror 600 reverses the velocity distribution: the fast, higher energy electrons 610 now trail the lower energy electrons 620. The potential of the inner electrodes 663, 664 and 665 is varied to tune the path differential $2 \times \Delta z$ between the slow electrons 620 and the fast electrons 610 in the pulse and to tune an aberration coefficient of the electron mirror 600, while maintaining the mirror in a focused state. In one implementation, the potential of inner electrode 663 is tuned to adjust the path differential, and the potential of inner electrode 664 is tuned to adjust the chromatic or spherical aberration coefficient, while the potential of inner electrode 665 is tuned to maintain the mirror 600 in a focused state. Once the electron pulse leaves the electron mirror 600, the fast, higher energy electrons 610 begin to catch up with the lower energy electrons 620 until a temporal focus is established at a certain drift distance from the electron mirror 600. In addition, the electron mirror 600 introduces a chromatic or spherical aberration coefficient that can be used to compensate the chromatic or spherical aberration of the objective lens 140. Tuning of the potential of inner electrode 663 allows to adjust the temporal focus point downstream from the electron mirror 600, while tuning of the potential of inner electrode 664 allows to adjust the chromatic or spherical aberration coefficient in order to cancel the the chromatic or spherical aberration of the objective lens 140.

Figure 7:
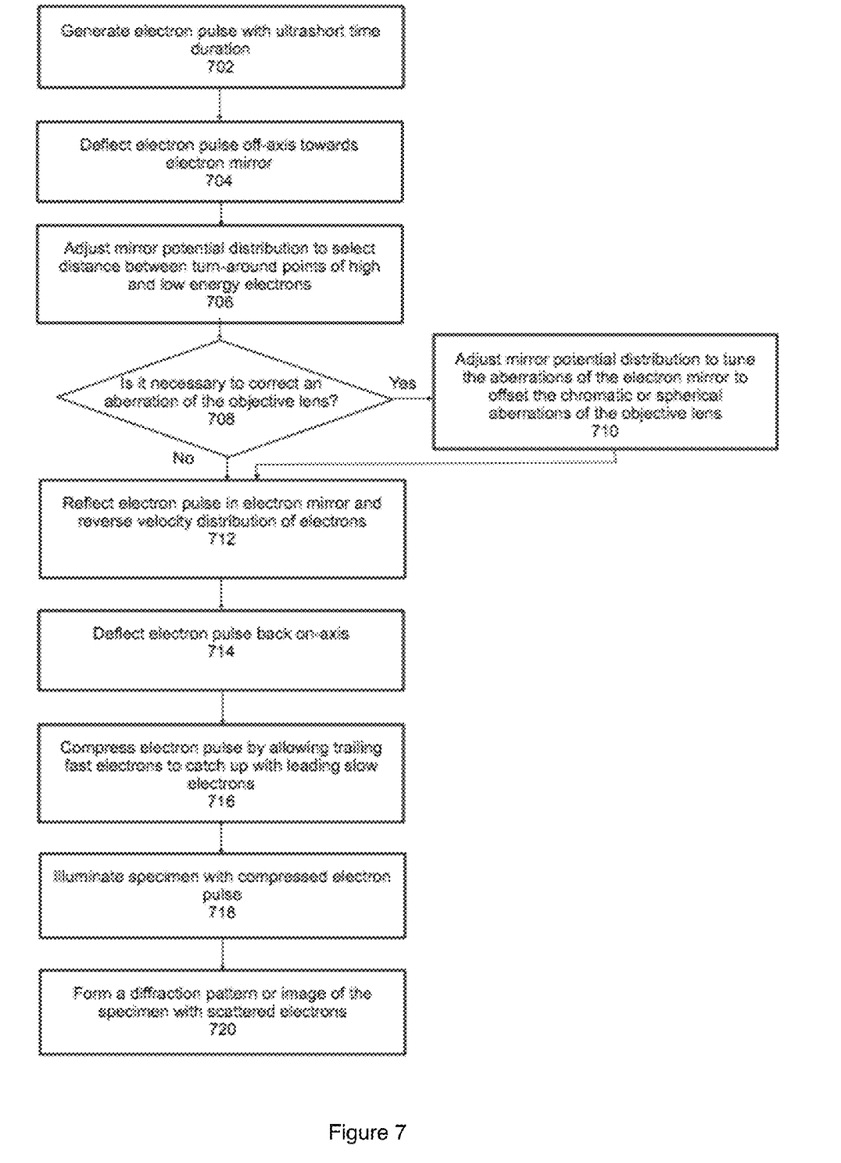
FIG. 7 is a flow chart depicting a method for obtaining an image or diffraction pattern of a specimen using an electron mirror-based pulse compressor in accordance with an embodiment of the invention.

FIG. 7 is a flow chart depicting a method 700 for compressing an electron pulse using a prism separator and electron mirror in accordance with an embodiment of the invention. This method 700 may use the structures 100, 160, 300, 400, 500 and 600 described above in relation to FIGS. 1-6.

In this method 700, an ultrashort electron pulse with nominal energy $E_0$ is generated 702 by an electron gun. The electron pulse is deflected 704 by 90 degrees off axis by a prism separator and transported into an electron mirror. The potential distribution of the electron mirror is adjusted 706 to tune the path differential between the turn-around points of the slow and the fast electrons. When correction of objective lens aberrations is desired 708, the potential distribution of the electron mirror is adjusted 710 to tune the aberrations of the electron mirror to offset the aberrations of the objective lens 140. The electron pulse reflects 712 in the electron mirror and due to to the difference in kinetic energies of the electrons in the pulse, the velocity distribution is reversed, i.e. the faster electrons trail the slower electrons. The electron pulse with reversed velocity distribution is then deflected 714 by 90 degrees back on axis. The fast, higher energy electrons catch up with the lower energy electrons and compress 716 the electron pulse at the plane of temporal focus, which is located at a certain drift distance from the electron mirror. The compressed electron pulse with reduced temporal spread is then directed to illuminate the specimen 718. The electron pulse is scattered by the specimen and the scattered electrons form 720 a diffraction pattern or image of the specimen.

Advantageously, the above-disclosed technique combines a prism separator that does not introduce significant aberrations and an electron mirror, which can compress pulses with varying number of electrons and can be tuned to match different column geometries. This technique utilizes static electron-optical components to achieve the pulse compression and thus does not suffer from the jitter problems encountered in the RF cavity approaches. Another key advantage is the use of a 90 degree deflection in the magnetic prism separator that allows the compressor to be readily incorporated into the straight column axis of existing UED and DTEM instruments, thereby significantly simplifying the column alignment and improving its stability. The beam separator also allows the pulse to enter the electron mirror at normal incidence, which minimizes the aberrations introduced by the mirror. The symmetry in the geometry of the unit comprising the beam separator and the mirror eliminates any energy dispersion that would further deteriorate the quality of the pulse front. Furthermore, the electron mirror provides the capability to compensate the aberrations of the objective lens in the UED and DTEM instruments.

CONCLUSION

A pulse compressor comprising an magnetic prism separator and an electron mirror is disclosed herein. An electron source is illuminated by a pulsed photon beam and configured to generate a pulse of electrons. The prism separator deflects the electron pulse by 90 degrees off the optical axis and towards the electron mirror. Higher energy electrons are faster and form the leading edge of the pulse, while lower energy electrons are slower and form the trailing edge of the pulse. Higher energy electrons penetrate more deeply into the retarding field of the electron mirror than the lower energy electrons, leading to a longer path length in the mirror. Lower energy electrons penetrate less deeply into the retarding field of the electron mirror than the higher energy electrons, leading to a shorter path length in the mirror. After reflection, the lower energy electrons exit the electron mirror before the higher energy electrons and form the leading edge of the pulse, while higher energy electrons exit the electron mirror after the low energy electrons and form the trailing edge of the pulse. The reflected electron pulse reenters the prism separator and is deflected by 90 degrees back on the optical axis. As the electron pulse travels towards the specimen, the faster high energy electrons catch up with the slower electrons, thus compressing the electron pulse. The compressed electron pulse strikes the specimen and the electrons scattered by the specimen are used to form an image or diffraction pattern of the specimen.

In accordance with certain embodiments of the invention, this pulse compressor provides the opportunity to illuminate specimens with an electron pulse with ultrashort duration. Hence, very high temporal resolution imaging and diffraction is obtainable in electron microscopes used to characterize specimens.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for producing an electron pulse with reduced temporal width from an electron pulse with a large temporal width, the apparatus comprising:
    an electron source configured to generate a short pulse of electrons with a range of energies and propagating along an optical axis;
    an electron mirror configured to:
        receive the electron pulse, wherein the high-energy component of the electron pulse enters prior to the low-energy component of the electron pulse, and
        decelerate the electron pulse, wherein the high-energy component of the electron pulse penetrates more deeply into the electron mirror than the low-energy component of the electron pulse, and
        reflect and reaccelerate the electron pulse so that the the low-energy component of the electron pulse exits prior to the high-energy component of the electron pulse;
    an objective lens located along the optical axis downstream from the electron source;
    an electron-deflecting device located along the optical axis between the electron source and objective lens and configured to:
        receive the electron pulse from the electron source and deflect the electron pulse by ninety degrees towards the electron mirror, and
        receive the electron pulse reflected by the electron mirror and deflect the electron pulse by ninety degrees towards the objective lens.

2. The apparatus of claim 1, wherein the electron-deflecting device is a magnetic prism composed of an array of uniform magnetic fields of different length and strength with corresponding transient magnetic fields.

3. The apparatus of claim 1, wherein the electron pulse is generated by illuminating an electron emitter with a pulsed laser.

4. The apparatus of claim 1, wherein the electron mirror is configured to vary the turn-around point of the high-energy and low-energy component of the electron pulse in the electron mirror.

5. The apparatus of claim 1, wherein the electron mirror is configured to correct one or more aberrations introduced by the objective lens.

6. The apparatus of claim 1, further comprising a plurality of electron lenses configured to:
    transport the electron pulse from the electron source towards the electron-deflecting device,
    transport the electron pulse from the electron-deflecting device towards the electron mirror and back, and
    transport the electron pulse from the electron-deflecting device towards the objective lens.

7. The apparatus of claim 1, further comprising:
    a specimen scattering the impinging electron pulse; and
    an electron detector configured to observe the distribution of the scattered electron pulse.

8. The apparatus of claim 7, further comprising a plurality of electron lenses configured to form a magnified image of the distribution of the scattered electron pulse on the electron detector.

9. A method for generating an electron pulse with reduced temporal width from an electron pulse with a large temporal width, the method comprising:
    generating an electron pulse with a range of electron energies along an optical axis;
    deflecting the electron pulse off-axis by ninety degrees towards an electron mirror;
    decelerating the electron pulse in the mirror, wherein the high-energy component of the electron pulse penetrates more deeply into the electron mirror than the low-energy component of the electron pulse;
    reflecting and reaccelerating the electron pulse so that the the low-energy component of the electron pulse exits the mirror prior to the high-energy component of the electron pulse;
    deflecting the electron pulse by ninety degrees back on-axis;
    allowing the electron pulse to drift along the optical axis, wherein the high-energy component of the electron pulse catches up with the low-energy component of the electron pulse at a temporal focus point downstream from the electron-deflecting device along the optical axis.

10. The method of claim 9, wherein the electron pulse is generated by illuminating an electron emitter with a pulsed laser.

11. The method of claim 9, wherein the electron mirror is configured to vary the turn-around point of the high-energy and low-energy component of the electron pulse in the electron mirror.

12. The method of claim 9, further comprising:
a specimen located at a temporal focus point along the optical axis, and
an objective lens configured to illuminate the specimen.

13. The method of claim 12, wherein one or more aberrations introduced by the objective lens are corrected by the electron mirror.

14. The method of claim 12, further comprising the observation of the distribution of the electron pulse scattered by the specimen on an electron detector.

15. The method of claim 12, further comprising the formation of a magnified image of the specimen on an electron detector.

\* \* \* \* \*